United States Patent [19]

Tanaka et al.

[11] 4,040,084
[45] Aug. 2, 1977

[54] SEMICONDUCTOR DEVICE HAVING HIGH BLOCKING VOLTAGE WITH PERIPHERAL CIRCULAR GROOVE

[75] Inventors: Tomoyuki Tanaka; Masahiro Okamura; Takuzo Ogawa; Yutaka Misawa, all of Hitachi, Japan

[73] Assignee: Hitachi, Ltd., Japan

[21] Appl. No.: 610,786

[22] Filed: Sept. 5, 1975

[30] Foreign Application Priority Data

Sept. 18, 1974 Japan .............................. 49-106714

[51] Int. Cl.² ...................... H01L 29/06; H01L 29/72; H01L 29/34
[52] U.S. Cl. ....................................... 357/55; 357/34; 357/56; 357/20; 357/52
[58] Field of Search ...................... 357/42, 55, 34, 56, 357/20, 52

[56] References Cited

U.S. PATENT DOCUMENTS

| 3,738,877 | 6/1973 | Davisohn | 357/55 |
| 3,821,782 | 6/1974 | Hutson | 357/55 |
| 3,878,552 | 4/1975 | Rodgers | 357/55 |

FOREIGN PATENT DOCUMENTS

| 84,515 | 1/1965 | France | 357/55 |
| 1,564,255 | 9/1969 | Germany | 357/55 |
| 1,071,574 | 6/1967 | United Kingdom | 357/55 |

Primary Examiner—Andrew J. James
Attorney, Agent, or Firm—Craig & Antonelli

[57] ABSTRACT

A semiconductor device having a high blocking voltage, comprises a pair of principal surfaces opposite to each other, a circular groove cut in the peripheral portion of one of the principal surfaces and a PN junction formed along the surface of the groove and the one of the principal surfaces, wherein the region on the side of the PN junction near the one of the principal surfaces is of high impurity concentration, the outer edge of the PN junction appears in the bevel surface connecting the pair of principal surfaces, and the edge of the PN junction intersects the bevel surface in such a manner that the angle therebetween in the region of high impurity concentration is obtuse.

15 Claims, 11 Drawing Figures

SEMICONDUCTOR DEVICE HAVING HIGH BLOCKING VOLTAGE WITH PERIPHERAL CIRCULAR GROOVE

BACKGROUND OF THE INVENTION

Field of the Invention

The present invention relates to semiconductor devices such as diodes, transistors, thyristors etc. and more particularly to a semiconductor device having a high blocking voltage and a method for producing the same.

The semiconductor devices are classified into planar type, mesa type and bevel type, depending on the structure of PN junction formed between the P-type and N-type regions. In the planar type, the edges of all the PN junctions are exposed in one of the principal surfaces while in case of the mesa type the edges of the PN junctions are exposed in the etched-down surface in the periphery of one of the principal surfaces. In the bevel type, the edges of the PN junctions are exposed in the side surface connecting the two principal surfaces, the edges of the PN junctions intersecting the side surface perpendicularly or slantingly. The planar and the mesa type structures are suitable for the case where numerous pellets are produced from a large-area semiconductor wafer and these structures are preferred in small power semiconductor devices. On the other hand, the bevel structure is adapted for a power semiconductor device which must be provided with a substrate having a larger area.

The exposed edges of the PN junction are active and therefore easily affected by the atmosphere. For this reason, the exposed edges and their neighboring region are covered by insulating material for passivation. The insulator coating is referred to as passivation film. In the fabrication of planar and mesa type semiconductor devices, the passivation film can be formed before a large-area semiconductor wafer is scribed into numerous pellets, so that the formation of the passivation film is facilitated. In the production of a bevel type semiconductor device, the passivation film must be formed only after a semiconductor wafer is split into pellets. It requires highly specialized techniques and much labor to form a passivation film on the desired area of a small pellet with high accuracy. Thus, the formation of a passivation film in the fabrication of the bevel type device is much more intricate than in the fabrication of the planar and mesa type devices so that the efficiency of working the bevel type device is very low.

Now, the withstand voltages of the respective types will be considered.

In the planar type device, the PN junction has some portions bent almost at right angles, on which electric fields concentrate and since the regions on both the sides of the PN junction in the vicinity of the exposed edge of the PN junction are of high impurity concentration, the expansion of the depletion layer in the vicinity of the exposed edge is small. For these reasons, a semiconductor device of planar type, having a high blocking voltage is very difficult to fabricate. The blocking voltage of the planar type device is usually 300-400 V. In order to obtain higher blocking voltages with the planar structure, it is necessary to form a region called a guard ring, which encircles the exposed edge of the PN junction. The number of desired guard rings increases with the increase in the blocking voltage to be attained. Therefore, in the case where a semiconductor device having a high blocking voltage is fabricated in planar structure, there is incurred a drawback that the size of the device is too large.

The mesa type semiconductor device can blocking a voltage of about 600 V since it has no bent portion in the PN junction and since the impurity concentrations of the regions on both the sides of the PN junction near the exposed edges of the PN junction are lower than those in the planar type device. For the achievement of higher withstand voltage with the mesa structure, the area of the exposed surface of the intermediate high resistance layer must be increased or the depth of etching-down must be increased. These artifices, however, give rise respectively to a drawback that the resulting device has too large a size and a drawback that the current conduction area is decreased. Namely, the etched-down surface of the mesa type device is so slanted that the areas of the cross sections of the low impurity concentration region by planes parallel to the PN junction and having successively descending levels may gradually increase (negative bevel structure). If the PN junction has its edge exposed in such a slant surface, the smaller the slant angle becomes, the greater is the blocking voltage. To attain higher blocking voltages with the mesa structure, the slanted angle of the etched-down slant surface must be made smaller. If the angle is rendered smaller, the area of the slant surface becomes larger. This leads to the drawback that the size of the resulting device is too large, as in the case of planar structure. On the other hand, if the etching is too deep, a mass production method in which after a large-area semiconductor wafer has been provided with PN junctions, passivation films and electrodes, the wafer is scribed into numerous pellets, cannot be adopted. In the application of the mass production method, it is necessary that even after the required etching has been performed, the thinnest portions of the semiconductor wafer, i.e. parts connecting individual pellets with one another, should have a thickness of at least 50 μ. A semiconductor substrate with a smaller thickness cannot be used as a large-area wafer since it is easily warped and broken during various processes. It is necessary to increase the thickness of the wafer and especially of the high resistance layer so as to make the substrate rigid enough. The increase in the thickness of the high resistance layer is accompanied by the degradations of characteristics such as increase in internal power loss and decrease in response speed.

In the bevel structure, the side surface in which the edge of the PN junction appears is so beveled that the area of the cross section of the high impurity concentration region by a plane parallel to the PN junction may be large (positive bevel structure) and it is needless to reduce the slant (bevel) angle of the slanted (side) surface as in the mesa structure. Therefore, the blocking voltage can be increased without increasing the size of the device. However, in this case too, there is still left a drawback that the mass production method mentioned above cannot be employed.

SUMMARY OF THE INVENTION

The object of the present invention is to provide a novel semiconductor device which has a high blocking voltage and which can be fabricated with a high yield through a method adapted for large-scale production and to provide a method for producing the novel semiconductor device.

The feature of the present invention, which has been made to attain such an object mentioned above, is the provision of a semiconductor substrate comprising a pair of principal surfaces located opposite to each other; a side surface connecting the pair of principal surfaces with each other; at least one PN junction formed between the pair of principal surfaces and a circular groove tapering toward the bottom, cut in the peripheral portion of one of the principal surfaces in which the high impurity concentration region on one side of the PN junction is exposed, wherein the PN junction is formed along the one of the principal surfaces and the surface of the circular groove and the edge portion of the PN junction appearing in the side surface intersects the side surface in such a manner that the angle of interception in the high impurity concentration region is obtuse.

The feature of the method for producing the semiconductor device mentioned above, according to the present invention, is the provision of at least a step of forming a first groove tapering toward bottom and encircling the region to serve as a functioning region in the one of the principal surfaces of the substrate; a step of forming through the diffusion of impurity from the surface of the first groove the peripheral portion of the PN junction provided to increase the blocking voltage of the functioning region and a step of forming a second groove around the first groove so as to make the edge of the peripheral portion of the PN junction exposed.

More concretely phrased, the feature of the present invention is that the first and the second grooves are so formed that the edge of the peripheral portion of the PN junction formed by diffusing impurity from the surface of the first groove may make an obtuse angle with the surface of the second groove, on the side of the high impurity concentration region.

According to the present invention described above, a plurality of semiconductor devices in which the edges of the peripheral portions of the respective PN junctions provided to increase the blocking voltage are in the positive bevel structure, are formed in a large-area semiconductor wafer, the required treatments are then performed on the wafer, and thereafter the wafer is split into the individual semiconductor devices.

DESCRIPTION OF THE PREFERRED EMBODIMENTS

The present invention will be described below by way of embodiment with the aid of the attached drawings.

Figure 1:
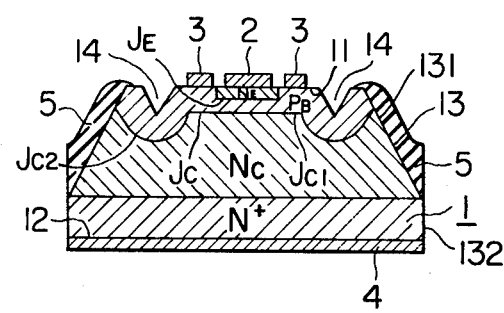
FIG. 1 schematically shows in cross section a semiconductor device having a high blocking voltage, as a first embodiment of the present invention.

FIG. 1 shows in cross section an NPN transistor which is a first embodiment of the present invention. In FIG. 1 are shown a semiconductor substrate 1 having a pair of principal surfaces 11 and 12 and a side surface 13 connecting the pair of surfaces 11 and 12; a circular groove 14 tapering toward bottom, e.g. a V-shaped groove, cut in the peripheral portion of one of the principal surfaces, i.e. surface 11; an N emitter layer $N_E$ formed in the substrate 1 with its surface exposed in the principal surface 11; a P base layer $P_B$ formed in the substrate 1 in contact with the N emitter layer $N_E$ to define an emitter junction $J_E$ between them, with its surface exposed in the principal surface 11, the surface of the groove 14 and the side surface 13; an N collector layer $N_C$ formed in the substrate 1 in contact with the P base layer $P_B$ to define a collector junction $J_C$ between them, with its surface exposed in the side surface 13; a layer N+ formed in the substrate 1 and having an impurity concentration higher than that of the layer $N_C$, with its surface exposed in the principal surface 12 and the side surface 13; an emitter electrode 2 kept in ohmic contact with the surface of the $N_E$ layer in the principal surface 11; a base electrode 3 kept in ohmic contact with the surface of the $P_B$ layer in the principal surface 11; a collector electrode 4 kept in ohmic contact with the surface of the N+ layer in the principal surface 12; and an insulator 5 such as glass, covering the slant portion 131 of the side surface 13. The $N_C$ layer and the N+ layer in combinaion may be regarded as an N collector layer, but they are described separately in this specification. The collector junction $J_C$ is a PN junction provided to increase the blocking voltage of the transistor and formed along the principal surface 11 and the surface of the groove 14. Namely, the collector junction $J_C$ consists of a flat portion $J_{C1}$ parallel to the principal surface 11 and a peripheral curved portion $J_{C2}$ beneath the groove 14. The side surface 13 consists of a slanted portion 131 and a vertical portion 132. The vertical portion 132 is contiguous and perpendicular to the principal surface 12 while the slanted portion 131 has such an inclination that the angle between the outer edge of the curved portion $J_{C2}$ of the collector junction $J_C$ and the slanted portion 131 is greater in the high impurity concentration region (the layer $P_B$ in FIG. 1) than in the low impurity concentration region (the layer $N_C$ in FIG. 1).

With this structure, the vertical portion 132 of the side surface 13 serves as a connecting part between individual pellets before they are separated from one another, as described later, and therefore the required treatments such as the formation of PN junctions, passivation films and electrodes can be performed on a large-area semiconductor wafer before it has been split into numerous pellets. This method of fabrication according to the present invention can be applied to a large-scale production system, enjoying a considerable merit in the field concerned. Moreover, since the collector junction $J_C$ which is a PN junction provided to increase the blocking voltage, consists of the flat portion $J_{C1}$ and the curved portion $J_{C2}$ and the edge of the curved portion $J_{C2}$ is exposed in the slanted portion 131 of the side surface 13 in the positive bevel configuration, then the blocking voltage can be increased without decreasing the current conduction area.

Figure 2A:
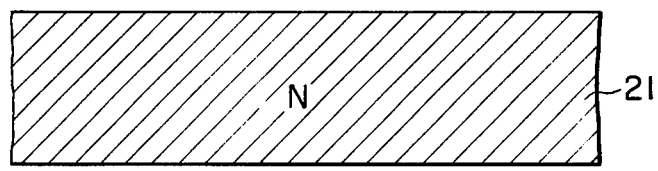
FIGS. 2a to 2g show steps of fabricating the semiconductor device shown in FIG. 1.
Figure 2B:
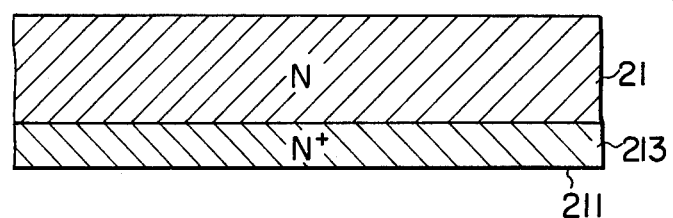
Figure 2C:
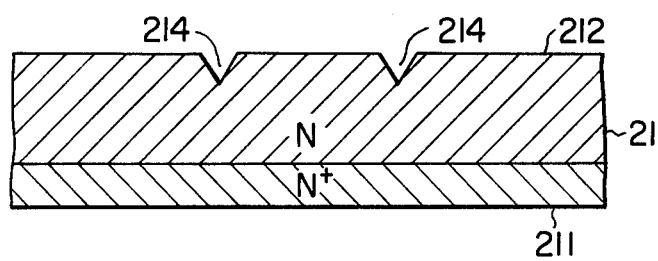
Figure 2D:
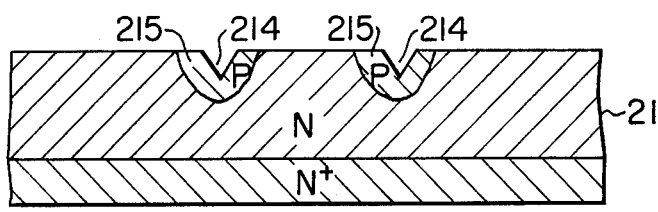
Figure 2E:
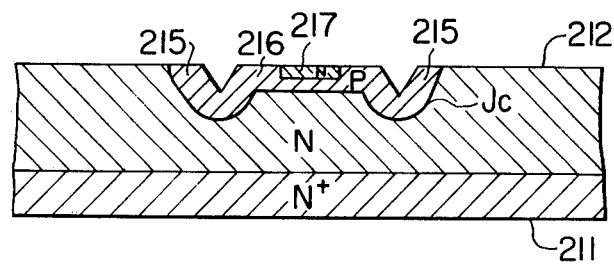
Figure 2F:
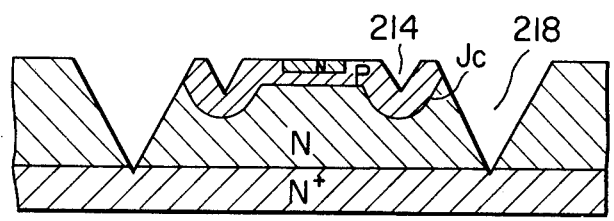
Figure 2G:
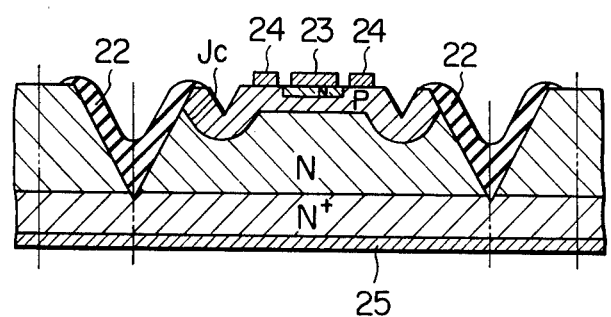

Next, the method of fabricating the NPN transistor shown in FIG. 1 will be illustrated in FIGS. 2a to 2g. An N type silicon plate 21 having a resistivity of about 100 Ω cm and having a pair of principal surfaces with a plane orientation (100), is prepared (FIG. 2a). A low resistance N+ layer 213 is formed through, for example, diffusion of phosphorus in the principal surface 211 of the silicon plate 21 (FIG. 2b). A first circular V-shaped groove 214 is formed in the principal surface 212 of the silicon plate through selective etching using etching solution (hereafter referred to as alkaline solution) containing potassium hydroxide and isopropyl alcohol as principal components (FIG. 2c). A plurality of such circular grooves are usually formed in the surface 212 so as to define so many functioning elements such as transistors therein, but for convenience' sake only one circular groove is shown in FIG. 2. A P type diffusion layer 215 is formed along the first groove 214 in the silicon plate 21 through, for example, diffusion of boron from the surface of the groove 214 (FIG. 2d). A P type diffusion layer 216 contiguous to the diffusion layer 215 is formed through, for example, diffusion of boron in the portion of the principal surface 212 of the silicon plate 21 enclosed by the diffusion layer 215 and an N type diffusion layer 217 is formed in the diffusion layer 216 through, for example, diffusion of phosphorus (FIG. 2e). Accordingly, between the N type region of the silicon plate 21 and the diffusion layers 215 and 216 is formed a PN junction $J_C$ consisting of a flat portion roughly parallel to the principal surface 212 and a curved portion curving along the groove 214. The N type region of the silicon plate 21 and the low resistance layer 213 serve as collector, the diffusion layers 215 and 216 as base, and the diffusion layer 217 as emitter. A second circular V-shaped groove 218 is formed in the principal surface 212 through etching using the alkaline solution mentioned above, encircling the first groove 214 (FIG. 2f). The second groove 218 is so formed that the outer edge of the curved portion of the PN junction $J_C$ may be exposed in the inner slanted wall of the second V-shaped groove 218. The bottom of the second groove 218 may reach the N+ layer 213, but the thinnest portion of the plate 21 (at the bottom of the second groove 218) must be rigid enough in the treatment of the plate as a silicon wafer, that is, that portion must be at least 50 $\mu$ thick. The surface of the second groove 218 is covered with, for example, glass layer 22 and an emitter, a base and a collector electrodes 23, 24 and 25 are formed on the principal surfaces (FIG. 2g). Finally, the silicon plate 21 is cut along the chain line to obtain a semiconductor device shown in FIG. 1, having a high blocking voltage.

Figure 3:
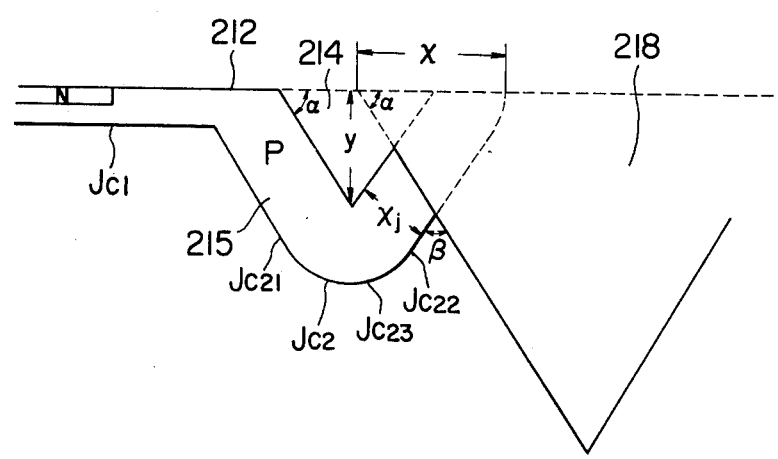
FIG. 3 is an enlarged partial view of a semiconductor device, for illustrating the effect of the present invention.

According to the method described above, there can be obtained with high reproducibility semiconductor devices having a high blocking voltage, in which the edge of the PN junction provided to increase the blocking voltage is in the positive bevel configuration. The detailed structure of the semiconductor device according to the present invention will be described with the aid of FIG. 3. FIG. 3 shows on a magnified scale a part of the semiconductor device shown in FIG. 1, near the first and the second grooves, the glass layer 22 and the electrodes being omitted for simplicity's sake. In case of selectivity etching the principal surface 212 of the silicon plate 21 having a plane orientation of (100), by the alkaline solution described above, the angle $\alpha$ between the surface 212 and the slanted surface of the resulting V-shaped groove is set equal to approximately 55°. The curved portion $J_{C2}$ of the PN junction $J_C$ formed by diffusing impurity from the surface of the first groove 214 consists of two slanted surfaces $J_{C21}$ and $J_{C22}$ intersecting the principal surface 212 at an angle of about 55° and a curved surface $J_{C23}$ connecting the two slanted surfaces $J_{C21}$ and $J_{C22}$ and having a radius of curvature equal to the depth $x_j$ of the diffusion layer 215. Consequently, the angle $\beta$ between the outer slanted surface $J_{C22}$ of the PN junction $J_C$ and the inner slanted surface of the second groove 218 is given as follows:

$\beta = 35°-70°$ for $x$ ranging from 0 to 0.48 $x_j$ and
$\beta \approx 70°$ for $x$ ranging from 0.48 $x_j$ to (0.48 $x_j$ + 1.22 $y$), where $x$ is the distance between the point at which the slanted surface $J_{C22}$ intersects the principal surface 212 and the point at which the inner slanted surface of the second groove intesects the principal surface 212, and $y$ is the depth of the first groove 214. For example, if $x_j = 50 \mu$ and $y = 50 \mu$, $\beta \approx 35°-70°$ for $x$ ranging from 0 to 2 $\mu$ and $\beta \approx 70°$ for $x$ ranging from 24 to 85 $\mu$. This means that the angle $\beta$ can be kept constant even if the position of the second groove is shifted within a tolerance of about 60 $\mu$ and especially that a preferable structure with $\beta = 70°$, of all the positive bevel configurations in which the high impurity concentration side of the PN junction has a larger area than the low impurity concentration side of the same PN junction, can be easily obtained with high reproducibility.

Moreover, according to the method described above, a plurality of bevel type semiconductor devices can be formed on a large-area semiconductor wafer so that semiconductor devices having a positive bevel configuration and therefore a high blocking voltage can be obtained on a large-scale production system.

In the method of producing semiconductor devices, shown in FIG. 2, the following variation may be incorporated. Namely, the first and the second grooves, which are most preferably formed by selectively etching the surface (100) by an alkaline solution, may also be formed through etching using a mixture solution of hydrazine and isopropyl alcohol or of ethylenediamine and pyrocatechol, sandblast or scribing. In those cases, the angles $\alpha$ and $\beta$ described above can be arbitrarily set by controlling the inclinations of the slanted surfaces of the first and the second grooves. The preferable values of the angle $\beta$ in the positive bevel configuration fall within a range of 15°-70° and the angle $\alpha$ can be arbitrarily chosen within a range of 82.5°-55° if the angle $\beta$ is in the range of 15°-70°. Further, according to the method shown in FIG. 2, the base region is formed through two steps of diffusion, but the region may be formed through a single step of diffusion. In that case, the time required for diffusion process can be shortened.

Figure 4:
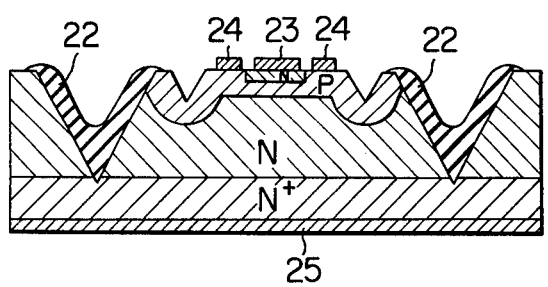
FIGS. 4 and 5 schematically show in cross section semiconductor devices having high blocking voltages, as a second and a third embodiment of the present invention.

FIG. 4 shows a semiconductor device having a high blocking voltage, as a second embodiment of the present invention. The only difference in this embodiment from that shown in FIG. 1 is that the first groove 214 is surrounded by the second groove 218 in its complete form. With this structure, the glass layer 22 is not cut when the individual semiconductor devices are separated from the silicon wafer, so that the yield in production is much improved. This structure can be obtained by cutting the semiconductor plate 21 along the two-dot chain line in FIG. 2g.

Figure 5:
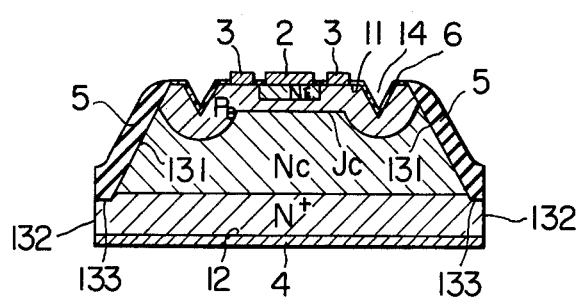

FIG. 5 shows a semiconductor device having a high blocking voltage, as a third embodiment of the present invention. This embodiment is characterized by the side surface 13 consisting of a slanted portion 131, a vertical portion 132 and a horizontal portion 133 connecting the slanted and vertical portions 131 and 132, parallel to the principal surface 12. Reference numeral 6 shows a film of $SiO_2$. The advantage of this structure is that the insulator 5 is prevented from injury which might be caused in dicing in case of the structure shown in FIG. 1.

In conclusion, the numerical data of a semiconductor device as a test sample, according to the structure shown in FIG. 4, are given below.

| | |
|---|---|
| surface impurity concentration in $N_E$ layer | $1 \times 10^{20}$ atoms/cm$^3$ |
| thickness (depth) of $N_B$ layer | 25 μ |
| surface impurity concentration in $P_B$ layer | $1 \times 10^{19}$ atoms/cm$^3$ |
| depth of $J_{C1}$ | 50 μ |
| depth of $J_{C2}$ (from principal surface to deepest point) | 95μ |
| angle of intersection between $J_{C2}$ and side surface | 70° |
| resistivity of $N_C$ layer | 130 Ω cm |
| thickness (depth) of $N_C$ layer (under $J_{C1}$) | 255 μ |
| thickness (depth) of $N_C$ layer (under deepest point of $J_{C2}$) | 210 μ |
| average impurity concentration of N+ layer | $1 \times 10^{20}$ atoms/cm$^3$ |
| thickness of N+ layer | 150 μ |
| depth of first groove | 35 μ |
| angle between slanted walls of first groove | 70° |
| depth of second groove | 310 μ |
| angle between slanted walls of second groove | 70° |
| thickness of glass layer | about 20 μ |

In this case, the blocking voltage of the junction $J_C$ is 2200 V.

In the previous description, the present invention has been applied solely to a transistor, but it will be needless to say that the invention can also be applied to a general semiconductor device such as a diode, a thyristor etc.

We claim:

1. A semiconductor device having a high blocking voltage, comprising:
    a semiconductor substrate consisting of a pair of principal surfaces located opposite to each other, a side surface connecting said pair of principal surfaces with each other, at least one PN junction formed between said pair of principal surfaces and a first circular groove cut in the peripheral portion of one of said principal surfaces in which the high impurity concentration region on one side of the PN junction is exposed, said first circular groove tapering off toward the other principal surface of said semiconductor substrate, said PN junction being formed along said one of said principal surfaces and the surface of said circular groove, and the outer edge of said PN junction appearing in said side surface intersecting said side surface in such a manner that the angle therebetween is greater in the region on the high impurity concentration side of said PN junction than in the region on the low impurity concentration side of said PN junction;
    an insulator covering at least the part of said side surface near the exposed edge of said PN junction; and
    at least a pair of electrodes in ohmic contact with said principal surfaces.

2. A semiconductor device as claimed in claim 1, wherein the region on one side of said PN junction near said one of said principal surfaces is of high impurity concentration and said first groove is V-shaped in cross-section.

3. A semiconductor device as claimed in claim 1, wherein said side surface consists of a slanted portion having an inclination with respect to the line perpendicular to said principal surfaces and a vertical portion approximately parallel to said perpendicular line, the outer edge of said PN junction being exposed in said slanted portion of said side surface.

4. A semiconductor device as claimed in claim 1, wherein a second circular groove having a greater depth than said first circular groove is cut in said one of said principal surfaces, surrounding said first groove so that a part of the surface of said second groove serves as a slanted portion of said side surface.

5. A semiconductor device as claimed in claim 4, wherein the region on one side of said PN junction near said one of said principal surfaces is of high impurity concentration and said first and second grooves taper off toward their bottoms.

6. A semiconductor device according to claim 1, wherein said principal surfaces of said semiconductor substrate have a (100) plane orientation.

7. A semiconductor device as claimed in claim 2, wherein said side surface consists of a slanted portion having an inclination with respect to the line perpendicular to said principal surfaces and a vertical portion approximately parallel to said perpendicular line, the outer edge of said PN junction being exposed in said slanted portion of said side surface.

8. A semiconductor device as claimed in claim 2, wherein a second circular groove having a greater depth than said first circular groove is cut in said one of said principal surfaces, surrounding said fist groove so that a part of the surface of said second groove serves as a slanted portion of said side surface.

9. A semiconductor device as claimed in claim 2, wherein said principal surfaces of said semiconductor substrate have a (100) plane orientation.

10. A semiconductor device having a high blocking voltage comprising:
    a semiconductor body having
        first and second principal surfaces disposed opposite to each other,
        a side surface extending from said first principal surface to said second principal surface, and
        first and second semiconductor regions of opposite conductivity types, said first region extending to said first principal surface and having an impurity concentration higher than that of said second region, defining therebetween a first PN junction which intersects said side surface such that the angle between said first PN junction and said first semiconductor region is larger than the angle between said second semiconductor region and said first PN junction, and
    a circular groove, having a cross section which is tapered toward said second principal surface, formed in a peripheral portion of said first semiconductor region at said first principal surface;
    an insulator covering at least that portion of said side surface intersected by said first PN junction;
    a first electrode in ohmic contact with said first principal surface; and
    a second electrode in ohmic contact with said second principal surface.

11. A semiconductor device as claimed in claim 10, wherein said side surface consists of a slanted surface portion inclined with respect to a line perpendicular to said first and second principal surfaces and a vertical surface portion substantially perpendicular to said first and second principal surfaces.

12. A semiconductor device as claimed in claim 10, wherein a further circular groove having a depth extending beyond said first PN junction is cut in said first principal surface, and surrounds the first mentioned groove so that a portion of the surface of said further groove serves as part of said side surface.

13. A semiconductor device as claimed in claim 12, wherein said first mentioned circular groove has a V-shaped cross-section.

14. A semiconductor device as claimed in claim 13, wherein said principal surfaces of said semiconductor substrate having a (100) plane orientation.

15. A semiconductor device as claimed in claim 14, further including a third semiconductor region of a conductivity type opposite that of said first semiconductor region defining a second PN junction which extends to said first principal surface and is surrounded by said first mentioned circular groove.

* * * * *